US 11,487,610 B2

(12) United States Patent
Waldrop et al.

(10) Patent No.: US 11,487,610 B2
(45) Date of Patent: Nov. 1, 2022

(54) METHODS FOR PARITY ERROR ALERT TIMING INTERLOCK AND MEMORY DEVICES AND SYSTEMS EMPLOYING THE SAME

(71) Applicant: Micron Technology, Inc., Boise, ID (US)

(72) Inventors: William C. Waldrop, Allen, TX (US); Vijayakrishna J. Vankayala, Allen, TX (US); Scott E. Smith, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 777 days.

(21) Appl. No.: 15/975,703

(22) Filed: May 9, 2018

(65) Prior Publication Data

US 2019/0347157 A1    Nov. 14, 2019

(51) Int. Cl.
*G06F 11/00* (2006.01)
*G06F 11/10* (2006.01)
*G11C 29/42* (2006.01)

(52) U.S. Cl.
CPC .......... *G06F 11/1032* (2013.01); *G11C 29/42* (2013.01)

(58) Field of Classification Search
CPC .. G06F 11/1032; G06F 11/1048; G11C 29/42; G11C 29/028; G11C 29/021; G11C 2029/0409
USPC ................................. 714/731, 744, 800–805
See application file for complete search history.

(56) References Cited

U.S. PATENT DOCUMENTS

| | | | | |
|---|---|---|---|---|
| 2003/0226090 A1* | 12/2003 | Thayer | ................ | G06F 11/1016 714/763 |
| 2009/0037778 A1* | 2/2009 | Resnick | ............... | G11C 7/1045 714/48 |
| 2013/0077429 A1* | 3/2013 | Kondo | ................ | G11C 11/4076 365/230.06 |
| 2013/0080826 A1* | 3/2013 | Kondo | ..................... | G11C 7/22 714/6.2 |
| 2013/0117641 A1* | 5/2013 | Bains | .................. | G06F 11/1016 714/802 |
| 2013/0346836 A1* | 12/2013 | Song | ........................ | G06F 11/10 714/800 |
| 2014/0013168 A1* | 1/2014 | Bains | .................... | G06F 11/108 714/57 |
| 2014/0250353 A1* | 9/2014 | Choi | ........................ | G11C 5/04 714/800 |
| 2017/0018300 A1* | 1/2017 | Lee | ......... | G11C 11/406 |
| 2017/0229164 A1* | 8/2017 | Lee | ......... | G11C 11/406 |
| 2017/0322842 A1* | 11/2017 | Iwaki | ................ | G11C 13/0035 |
| 2018/0018217 A1* | 1/2018 | Cordero | ............. | G06F 11/1004 |
| 2019/0034365 A1* | 1/2019 | Lovelace | ............ | G06F 13/1689 |

* cited by examiner

*Primary Examiner* — Albert Decady
*Assistant Examiner* — Osman M Alshack
(74) *Attorney, Agent, or Firm* — Perkins Coie LLP

(57) ABSTRACT

Systems and methods are described, in which a parity error alert timing interlock is provided by first waiting for a timer to count a configured parity error pulse width value and then waiting for any in-progress memory operations to complete before deasserting a parity error alert signal that was asserted in response to the detection of a parity error in a command or address.

20 Claims, 7 Drawing Sheets

METHODS FOR PARITY ERROR ALERT TIMING INTERLOCK AND MEMORY DEVICES AND SYSTEMS EMPLOYING THE SAME

TECHNICAL FIELD

The present disclosure generally relates to semiconductor memory devices, and more particularly relates to methods for parity error synchronization and memory devices and systems employing the same.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including random-access memory (RAM), static random-access memory (SRAM), dynamic random-access memory (DRAM), and synchronous dynamic random-access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR), phase change memory (PCM), ferroelectric random-access memory (FeRAM), resistive random-access memory (RRAM), and magnetic random-access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

DETAILED DESCRIPTION

Systems and methods for parity error alert timing interlock are disclosed herein. The disclosed systems and methods align or interlock the timing of a parity error alert signal—generated when a command/address parity error is detected—to the completion of internal operations that were pending when the parity error was detected. As a result, the timing for the parity error alert signal is no longer than is required to block new commands while meeting minimum and maximum parity error alert pulse width timing specifications and allowing for pending internal operations to complete before deactivation of the parity error alert signal.

As will be discussed further below, elements of the presently disclosed technology described in the context of particular paragraphs and/or Figures may be combined with elements described in the context of other paragraphs and/or Figures. Furthermore, not all elements of the technology disclosed herein are required to practice the technology. Additionally, several details describing structures and/or processes that are well-known and often associated with integrated antennas for medical implants, but that may unnecessarily obscure some significant aspects of the present technology, are not set forth in the following description for purposes of clarity. Moreover, although the following disclosure sets forth several embodiments of the present technology, several other embodiments of the technology have different configurations or different components than those described in this section. As such, the present technology may have other embodiments, with additional elements and/or without several of the elements described below with reference to the figures.

Figure 1:
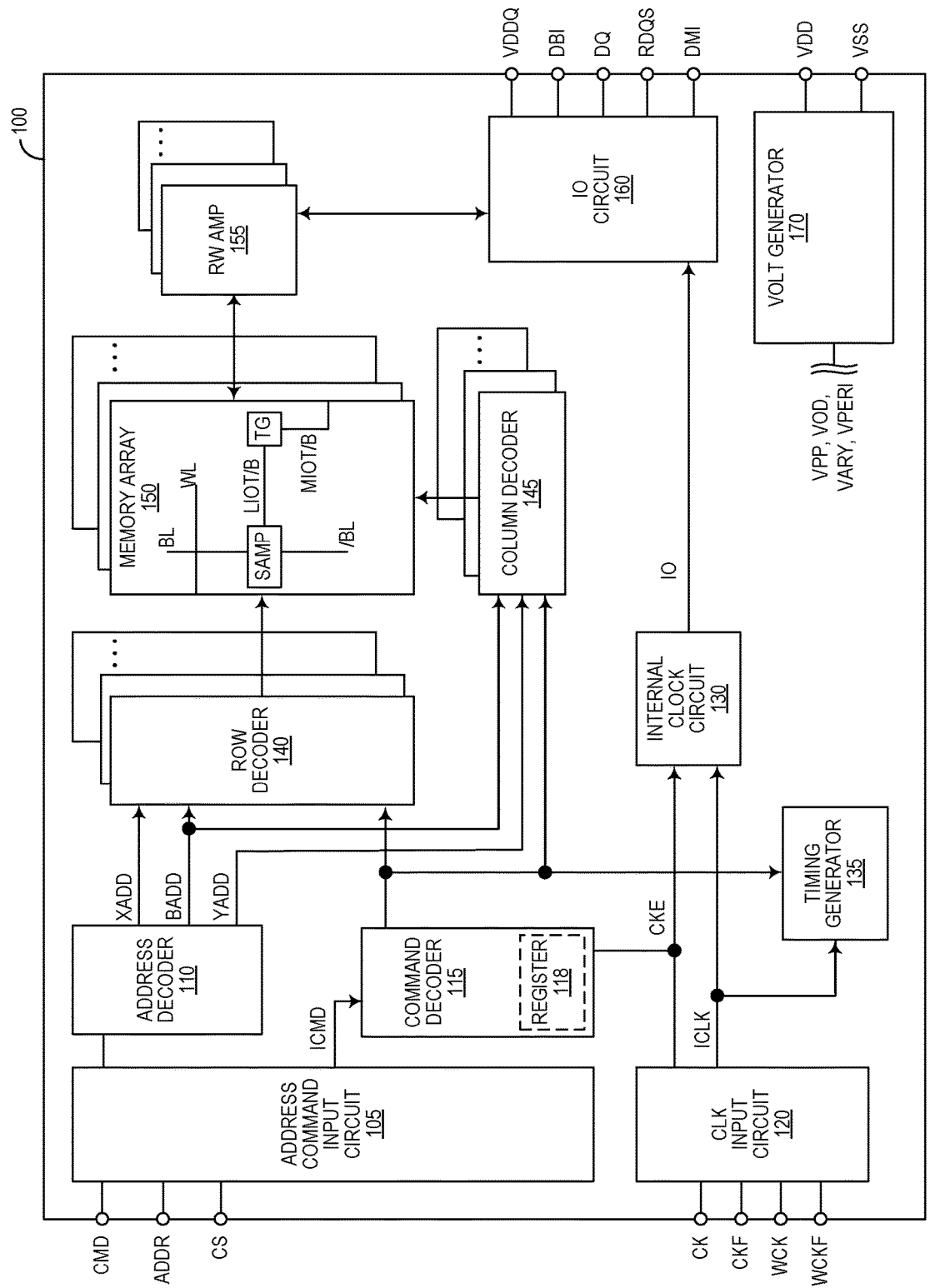
FIG. 1 is a block diagram schematically illustrating a memory device in accordance with an embodiment of the present technology.

FIG. 1 is a block diagram schematically illustrating a memory device 100 in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD)

to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK. The command decoder 115 may further include one or more registers 117 for tracking various counts or values (e.g., counts of refresh commands received by the memory device 100 or self-refresh operations performed by the memory device 100).

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The memory device 100 can be connected to any one of a number of electronic devices capable of utilizing memory for the temporary or persistent storage of information, or a component thereof. For example, a host device of memory device 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to memory device 100, although in other embodiments, the host device may be indirectly connected to memory device (e.g., over a networked connection or through intermediary devices).

Memory device 100 may also include parity error logic (not shown in FIG. 1) to enable command and address (C/A) parity, detect parity errors in command and address signals, and block command execution and alert the host if a parity error is detected. The additional delay, Parity Latency (PL), for executing commands when C/A parity is enabled versus a parity disabled mode can be programmed in the memory device 100, for example, in a mode register 118. The Parity Latency (PL) can be defined in terms of clock cycles of the CK clock signal. In some embodiments PL is 4, 5, 6, or 8 clock cycles. The Parity Latency can be applied to some or all of the commands received by the memory device 100 such that a command is held for the time of the Parity Latency before it is executed inside the memory device 100. That is, the issuing timing of internal commands in memory device 100 is determined with PL. Parity Latency may also be applied to write and read latency. When memory device 100 detects a parity error, parity error logic effects a number of actions as discussed below.

Figure 2:
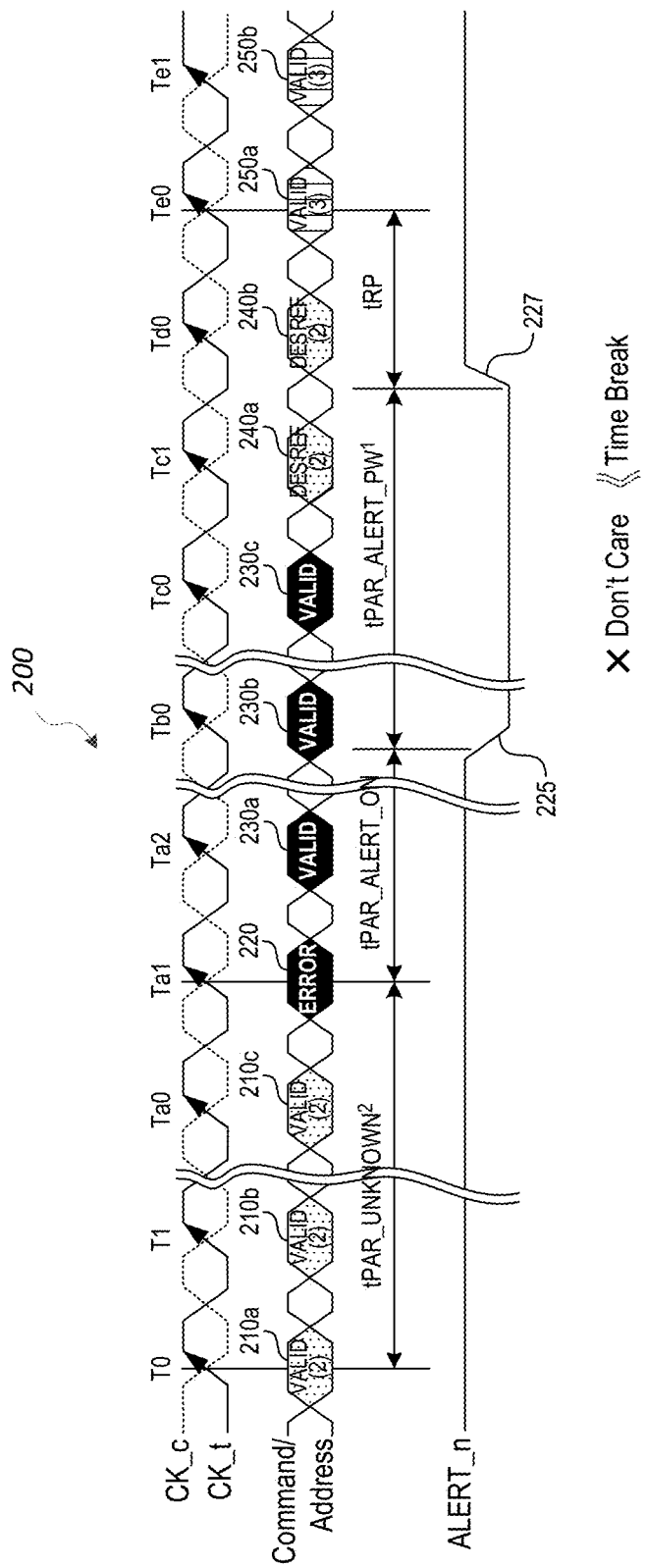
FIG. 2 is a representative plot of parity error alert activation signals in accordance with an embodiment of the present technology.

FIG. 2 illustrates a representative plot of parity error alert activation signals 200 in accordance with an embodiment of the present technology. For purpose of illustration, consider the case shown in plot 200 where the command or address at clock cycle 220 has a parity error. For example, if the convention of parity is even parity such that valid parity is defined as an even number of ones across the command or address inputs combined with the parity signal, the command or address at clock cycle 220 would have a parity error if it had an odd number of ones. Parity error detection logic in memory device 100 detects the parity error that occurred in clock cycle 220 at some time after the error occurred but no later than a maximum specified time, tPAR_ALERT_ON. In some embodiments, tPAR_ALERT_ON is partly based on the programmed Parity Latency value, for example PL+6 ns (e.g., if PL=8 clocks, and tCK=1.25 ns, tPAR_ALERT_ON=16 ns). After the parity error detection logic detects the parity error, it asserts an alert signal (e.g., sets ALERT_n=1'b0) to the host at time 225. The alert signal (e.g., ALERT_n) must be active (e.g., held low) for at least a tPAR_ALERT_PW(min) time but no longer than tPAR_ALERT_PW(max) time. After at least a tPAR_ALERT_PW(min) time, the parity error logic may deactivate the parity alert signal at time 227 (e.g., set ALERT_n=1'b1). In some embodiments, the minimum (tPAR_ALERT_PW(min)) and maximum (tPAR_ALERT_PW(max)) pulse width of the parity alert signal is defined in terms of clock cycles of the CK clock signal, for example if tPAR_ALERT_PW(min)=72 CK, tPAR_ALERT_PW(max)=144 CK, and tCK=833 ps, tPAR_ALERT_PW would have a range of around 60 ns to 120 ns.

In some embodiments as shown in plot 200 of FIG. 2, the external commands that occur a certain number of clocks prior to the command with the parity error (command at time 220 in FIG. 2) are not guaranteed to be executed. This "uncertainty" time window in which command execution is unknown is given by a tPAR_UNKNOWN time in FIG. 2. In some embodiments tPAR_UNKNOWN is based on the programmed Parity Latency (PL) value, e.g., if PL=8, tPAR_UNKNOWN=8 which means that the external commands that occurred up to 8 clocks prior to clock with the parity error may or may not be executed. When a READ command in tPAR_UNKNOWN window is not executed, for example, the memory device 100 does not active DQS outputs. In some other embodiments such as where parity error logic synchronously disables only the command that caused the parity error, tPAR_UNKNOWN=0 meaning that all commands prior to the command/address with parity error would be executed.

The parity error logic can disable command execution for the command or address with the parity error and all subsequent commands until a precharge recovery period time (tRP) after the parity alert signal is deactivated (ALERT_n=1'b1) (in some embodiments the alert signal is actually deactivated after tRP). That is, memory device 100 is not executing any commands during the window defined by tPAR_ALERT_ON+tPAR_ALERT_PW, where tPAR_ALERT_PW is at least tPAR_ALERT_PW(min), and at most tPAR_ALERT_PW(max).

In some embodiments, the actual pulse width of the parity alert signal (ALERT_n), tPAR_ALERT_PW, is fixed and is provided by a fixed delay circuit such as an analog delay element (e.g., with resistor/capacitor (RC) delay elements) or digital counter (e.g., with synchronous logic elements). In these embodiments, when the parity error logic detects the parity error that occurred at clock cycle 220, it asserts the parity error signal (ALERT_n=1'b0), starts the delay circuit that is configured to count up to a tPAR_ALERT_PW time period (or count down from tPAR_ALERT_PW time), and after the delay counter counts tPAR_ALERT_PW, the parity error logic deasserts the parity alert signal (ALERT_n=1'b1). In these embodiments, a tradeoff exists in what value of tPAR_ALERT_PW within the min/max values to configure the delay elements with. For example, if set tPAR_ALERT_PW at or close to tPAR_ALERT_PW(min), ALERT_n may deassert too soon while there are still internal operations in progress that were initiated before the parity error was detected. On the other hand, if set tPAR_ALERT_PW at or close to tPAR_ALERT_PW(max), ALERT_n may deassert later than it ideally needs to thereby unnecessarily blocking commands that would otherwise have been let to go through and as a result hurting the performance of memory device 100. Furthermore, configuring the delay circuit with a large tPAR_ALERT_PW increases the power consumption of the delay circuit and may result in larger occupied circuit area (e.g., larger resistors/capacitors or more synchronous and combinational logic elements). Additionally, setting tPAR_ALERT_PW too close to tPAR_ALERT_PW(max) or tPAR_ALERT_PW (min) may cause the parity alert signal pulse width to violate the specified max/min values due to process, voltage, and temperature variations. It is therefore desirable to configure the parity error logic of memory device 100 such that the parity alert signal pulse width, tPAR_ALERT_PW, is larger than tPAR_ALERT_PW(min), less than tPAR_ALERT_PW (max), and just as long as it needs to be within this range but no longer.

Figure 3A:
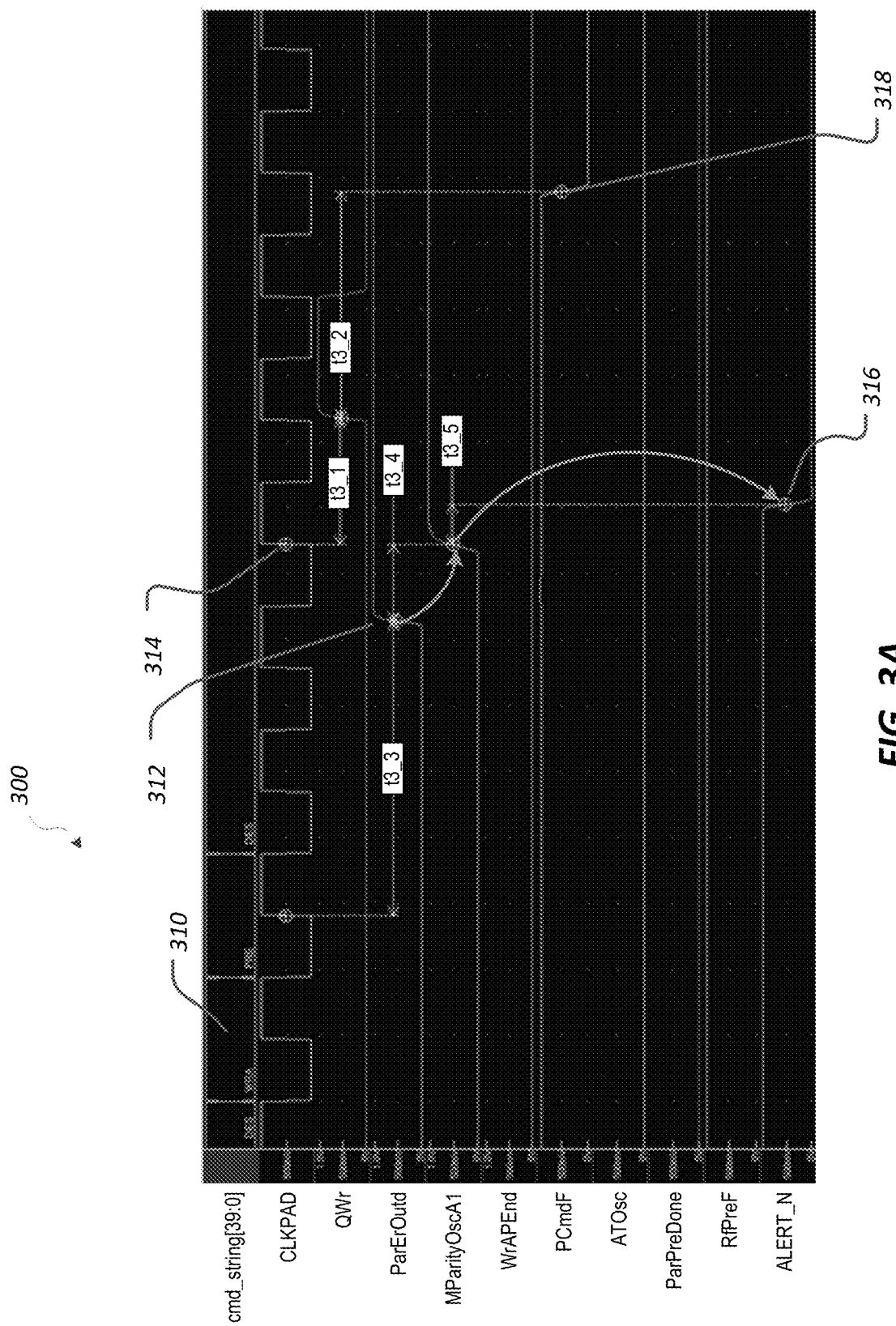
FIG. 3A is a representative plot of a first phase of a parity error alert activation following a write auto-precharge command in accordance with an embodiment of the present technology.

FIG. 3A is a representative plot 300 of a first phase of a parity error alert activation following a write auto-precharge command (WRA) 310 in accordance with an embodiment of the present technology. In the case where a parity error occurs after the WRA command 310, the parity error logic in memory device 100 detects the parity error (by computing command/address parity) and, at time 312, asserts an internal parity error signal (ParErOutd→1'b1). The internal parity error signal (ParErOutd) is latched, for example, on the next clock edge 314 (MParityOscA1→1'b1). The internal synchronous parity error signal (MParityOscA1) generates the parity error alert signal (Alert_n→1'b0) at time 316. Additionally, the parity error logic disables command execution by asserting a command disable signal (not shown in FIG. 3A) at a time after ParErOutd is asserted at time 312. In some embodiments, the delay in the assertion of the command disable signal relative to when the parity error occurs or is detected depends on the programmed parity latency value (PL).

Figure 3B:
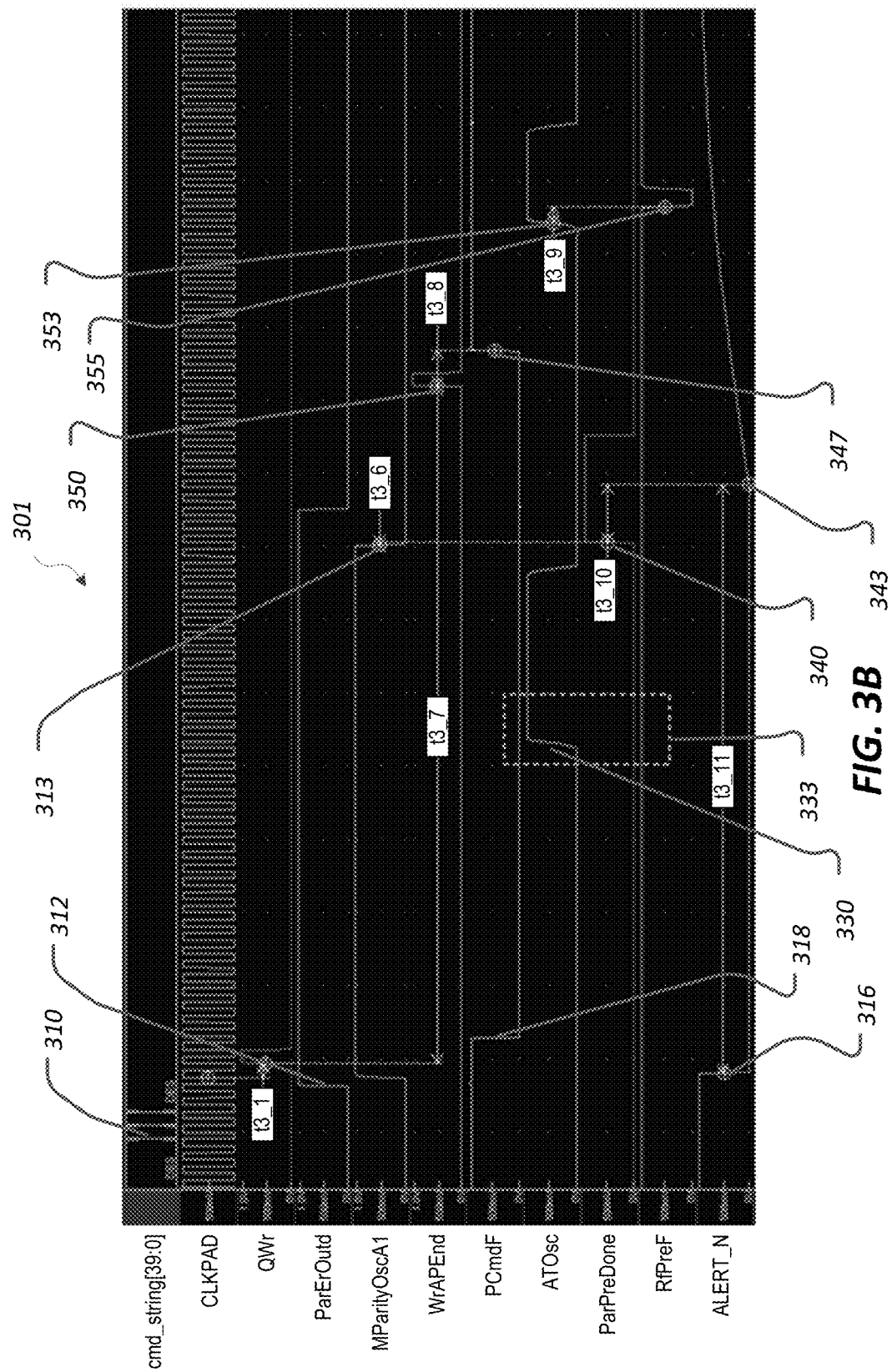
FIG. 3B is a representative plot of a second phase of a parity error alert activation following a write auto-precharge command in accordance with an embodiment of the present technology.

FIG. 3B is a representative plot 301 of a second phase of a parity error alert activation following a write auto-precharge command (WRA) 310 in accordance with an embodiment of the present technology. The assertion of command in-progress signal (PCmdF→1'b0) at time 318 blocks an array timer signal (ATOsc) from issuing a precharge. That is, at a rising edge 330 of the array time signal (ATOsc), the command in-progress signal (PCmdF=1'b0) prevents the a precharge trigger signal (RfPreF) from activating in window 333 (i.e., RfPreF stays at 1'b1 in window 333). As a result, the precharge operation associated with WRA command 310 does not occur and hence the row associated with the WRA command is not deactivated.

At time 313, the parity error logic detects that a delay timer (MParityOscA1) has counted the configured tPAR_ALERT_PW value, asserts, at time 340, a parity error done signal (ParPreDone→1'b1), and deactivates the parity error alert signal at time 343 (ALERT_n→1'b1), even though the command in-progress signal is still active until time 347. As see in FIG. 3B, in embodiments where the configured tPAR_ALERT_PW value is too short (but still longer than tPAR_ALERT_PW(min)), ALERT_n deactivates too soon at time 343 before the internal operations associated with WRA command 310 are done. A signal indicating when the WRA command 310 is done occurs at time 350 which is after ALERT_n is deactivated. Furthermore, at the next rising edge of the array timer signal (ATOsc) at time 353, because the command in-progress signal is now deasserted (PCmdF=1'b1), the precharge occurs at time 355 but this happens after ALERT_n has been deactivated. Such miscorrelation between the internal precharge timing and the ALERT_n signal timing is problematic because the system could issue commands that collide with such internal operations. Some embodiments particularly susceptible to the above identified issue are those where the memory device 100 is configured for a long tCK (time CK period), long CWL (CAS Write Latency), long tWR (Write time), and long AL (Additive Latency), and where the write error closely follows the WRA command 310. It is therefore desirable to configure the parity error logic such that it further delays the deactivation of the parity error signal (ALERT_n) until all internal operations are complete.

In some representative embodiments, the parity error logic generates parity error alert signals in accordance with the following timing (with reference to FIGS. 3A and 3B): t3_1=1.913 ns, t3_2=3.428 ns, t3_3=4.462 ns, t3_4=1.151 ns, t3_5=0.613 ns, t3_6=0.355 ns, t3_7=92.568 ns, t3_8=4.823 ns, t3_9=2.226 ns, t3_10=7.892 ns, and t3_11=80.431 ns.

Figure 4:
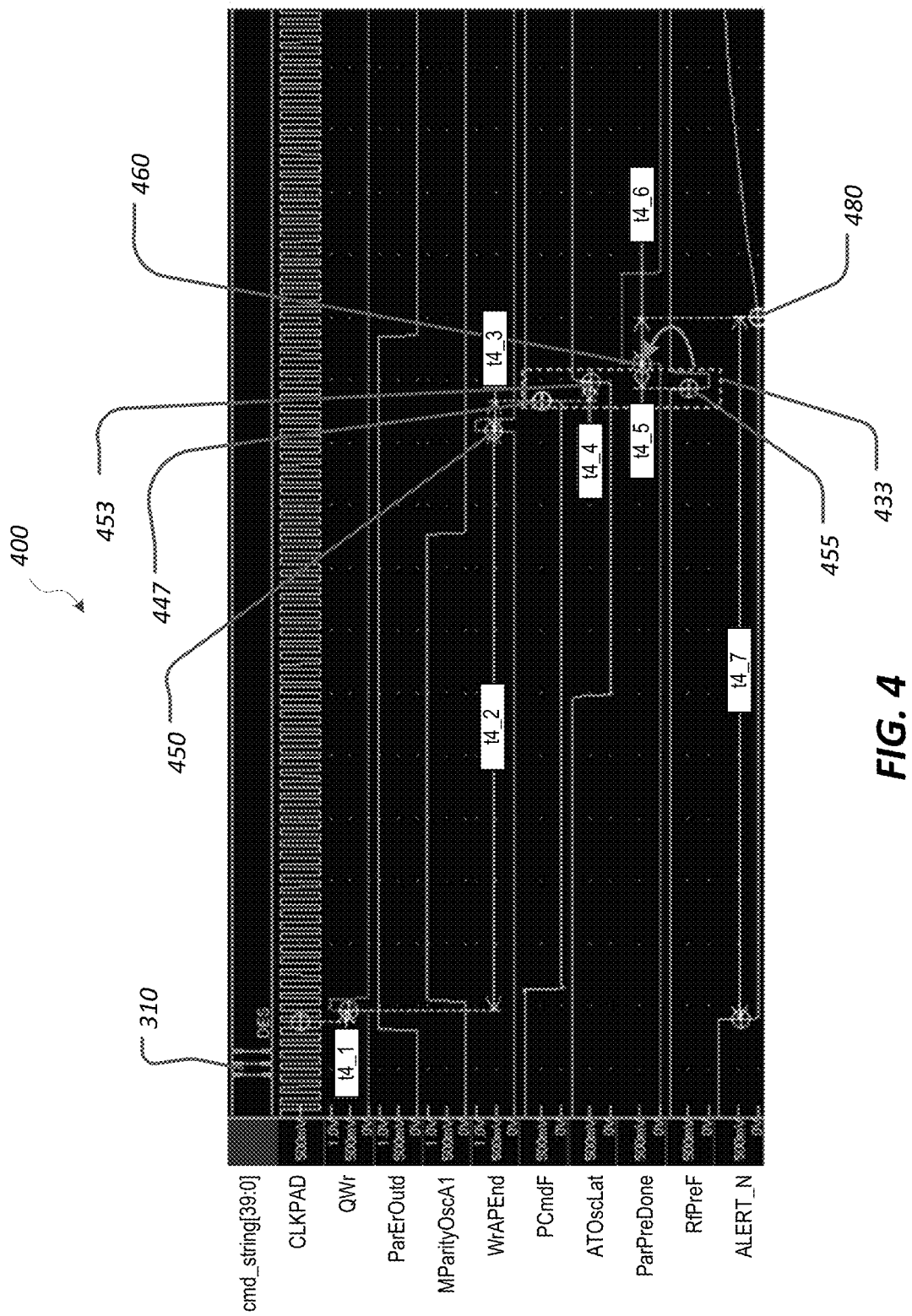
FIG. 4 is a representative plot of a parity error alert activation following a write auto-precharge command in accordance with an embodiment of the present technology.

FIG. 4 is a representative plot 400 of a parity error alert activation following a write auto-precharge command (WRA) 310 in accordance with an embodiment of the present technology. In this embodiment, parity error logic latches the array timer signal (ATOsc in FIG. 3B) to generate a latched array timer signal (ATOscLat in FIG. 4) such that a rising edge of the latched array timer signal (ATOscLat→1'b1) occurs at time 453 upon the command in-progress signal deactivating (PCmdF→1'b1). That is, the latched array timer signal (ATOscLat) is released and set high at time 453 upon the command in-progress signal (PCmdF) deasserting and transitioning high at time 447. This causes the the precharge trigger signal (RfPreF) to activate (RfPreF→1'b0→1'b1) within time window 433 to precharge the memory.

At time 460, the parity error logic asserts a parity error done signal (ParPreDone→1'b1) upon detection that (1) a delay timer has counted the configured tPAR_ALERT_PW value, and (2) internal operations are complete following activation of the precharge timer signal (RfPreF). The parity error logic then deactivates the parity error alert signal at time 480 (ALERT_n→1'b1) based the parity error done signal. That is, deactivation of ALERT_n in this embodiment depends on the timer counting through to the configured parity error pulse width value (tPAR_ALERT_PW) and the completion of internal operations (RD/WR operations in progress and internal precharge). Unlike in the embodiments disclosed in relation to FIG. 3B, the embodiments disclosed in relation to FIG. 4 disclose that the parity error alert signal is held active (ALERT_n=1'b0) until all internal operations are complete. When the parity error alert signal is deactivated at time 480, there is no risk of issued commands colliding with internal operations because the internal operations completed while ALERT_n was active (held low). When there are no internal operations in progress when the parity error is detected, the parity error alert signal deactivates upon timeout of the delay timer based on the configured parity error alert pulsewidth value (which must be greater than tPAR_ALERT_PW(min)). In some embodiments, the configured parity error alert pulse width value tPAR_ALERT_PW is chosen to provide some margin for process, voltage, or temperature variations in the delay circuits, i.e., tPAR_ALERT_PW=tPAR_ALERT_PW(min)+tMARGIN. For example, if tPAR_ALERT_PW(min)=80 ns and tMARGIN is chosen to be 10 ns, the configured tPAR_ALERT_PW that the delay circuit counts to/from would be 90 ns (tMARGIN is chosen such that tPAR_ALERT_PW+delay-to-complete-internal-operations is less than tPAR_ALERT_PW(max). In some embodiments either tPAR_ALERT_PW or tMARGIN or both are programmable.

In some representative embodiments, the parity error logic generates parity error alert signals in accordance with the following timing (with reference to FIG. 4): t4_1=1.857 ns, t4_2=92.554 ns, t4_3=4.81 ns, t4_4=3.068 ns, t4_5=4.012 ns, t4_6=7.235 ns, and t4_7=112.176 ns.

Figure 5:
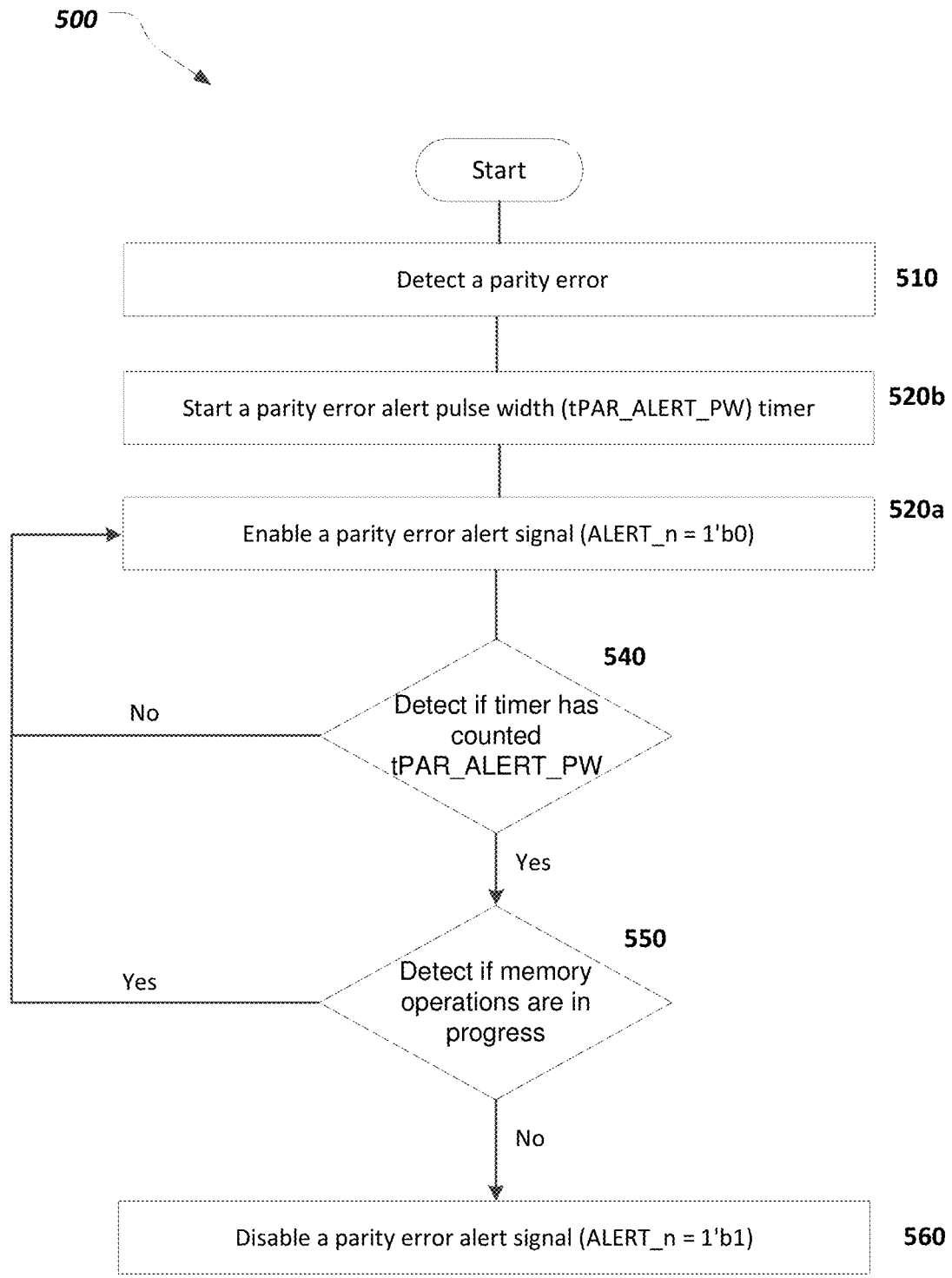
FIG. 5 is a representative flow diagram of a method for implementing a parity error alert timing interlock in accordance with an embodiment of the present technology.

FIG. 5 is a representative flow diagram 500 of a method for implementing a parity error alert timing interlock in accordance with an embodiment of the present technology. At block 510, parity error logic detects a parity error in a command or address associated with a memory device 100. The detection of parity error includes, for example, asynchronously calculating parity associated with address and command signals, followed by synchronously latching the asynchronous parity error signal. At block 520a, in response to detecting the parity error, the parity error logic enables a parity error alert signal (e.g., sets ALERT_n to a logic low) and concurrently starts a parity error alert pulse width timer at block 520b. Because the parity error alert pulse width timer is configured to set a minimum length of a parity alert signal (ALERT_n) when no internal operations are in progress, the parity error logic activates the timer at substantially the same time that if activates the parity error alert signal (although in actual implementations, this may be slightly before or slight after). The parity error alert pulse width timer is configured to count a preconfigured tPAR_ALERT_PW time. It will be appreciated that the parity error alert pulse width timer may be realized in a variety of circuit topologies including analog delay circuits, digital sequential logic, count down timer, count up timer, etc. At block 540, the parity error logic detects whether the parity error alert pulse width timer has counted a tPAR_ALERT_PW period and holds ALERT_n low if it has not. If it has counted a tPAR_ALERT_PW time, the logic detects, at block 550, if memory operations are still in progress and keeps ALERT_n low if they are. If, at block 550, the parity error alert pulse width timer has counted a tPAR_ALERT_PW time (i.e., has timed out) and there are no memory internal operations still in progress, the parity error logic disables the parity error alert signal (e.g., sets ALERT_n to a logic high) at block 560.

Figure 6:
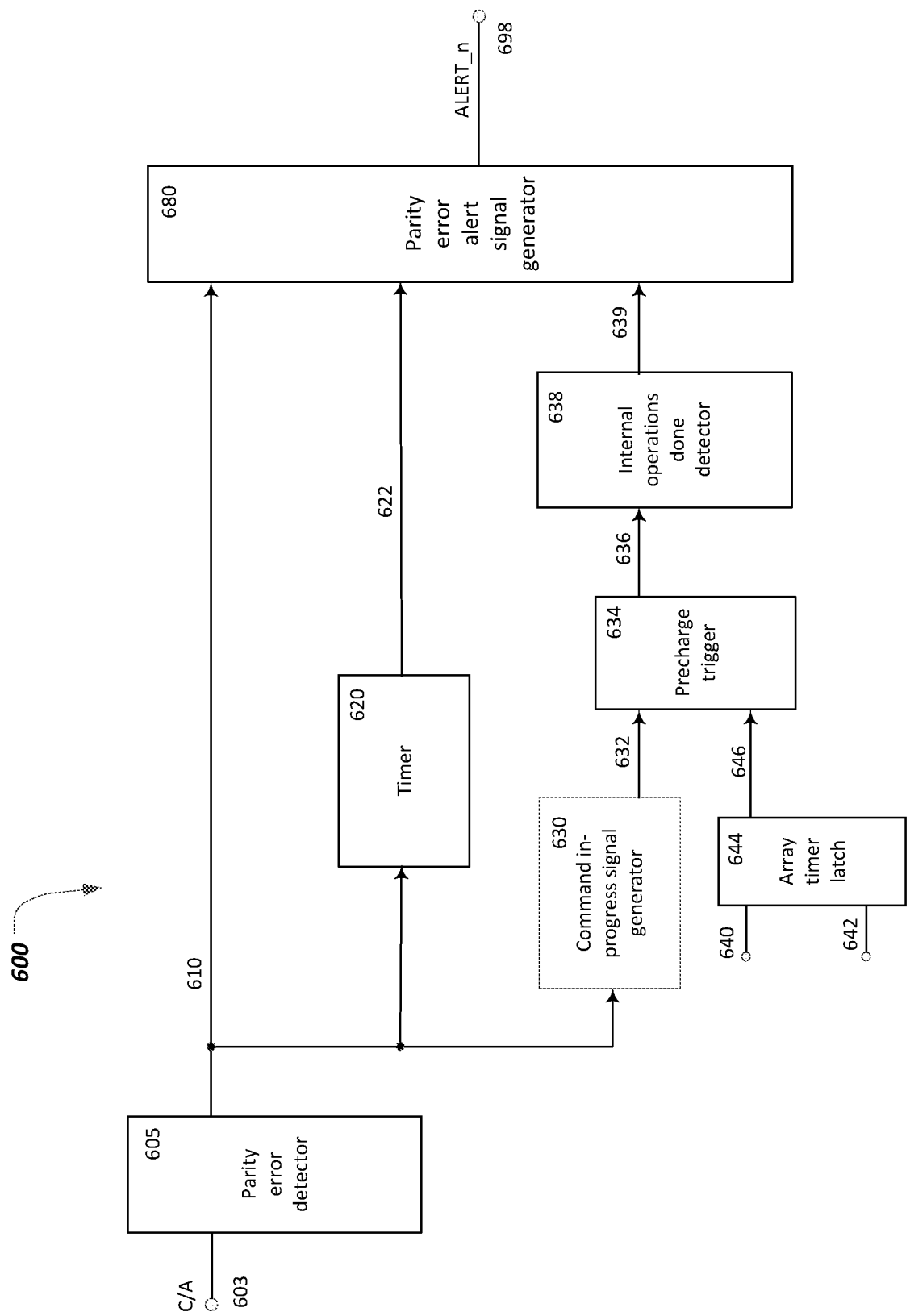
FIG. 6 is a representative system to implement a parity error alert timing interlock in accordance with an embodiment of the present technology.

FIG. 6 is a representative system 600 to implement a parity error alert timing interlock in accordance with an embodiment of the present technology. Command or address (C/A) signals 603 are provided to a parity error detector block 605 which computes the parity of the C/A signals and compares the detected parity against the configured parity scheme to determine if the C/A signals have a parity error. For example, if the configured parity scheme is even parity, the parity error detector block 605 counts the number of ones in the C/A signals (which includes parity bits) and if an odd number of ones is detected, parity error detector block asserts an internal parity error signal 610. The internal parity error signal 610 is received by a parity error alert signal generator block 680 which generates an external parity error alert signal 698 (ALERT_n) to the host. The internal parity error signal 610 is also received by a timer block 620 that is configured to count a period of time substantially equal to a parity error alert pulse width (tPAR_ALERT_PW) time. When the timer 620 times-out, it generates a timeout indication signal 622 which is received by the parity error alert signal generator block 680.

The internal parity error signal 610 is also received by a command in-progress signal generator block 630 which generates an internal command in-progress signal 632 indicating that internal commands are in progress. In some representative embodiments, the internal command in-progress signal 632 is active for a period of time based on the programed parity latency value (PL). The internal command in-progress signal 632, together with a latched array timer signal 646, is used by a precharge trigger block 634 to generate a precharge signal 636 used to precharge memory banks of memory device 100. The latched array timer signal 646 is generated by latching an array timer signal 640 with a clock 642 such that the latched array timer signal 646 outlasts the internal command in-progress signal 632. The precharge signal 636 is activated when the internal command in-progress signal 632 is disabled. An internal operations-done detector block 638 determines whether there are pending internal operations, for example, whether precharge signal 636 has been activated, and notifies the parity error alert signal generator 680 using a signal 639. The parity error alert signal generator block 680 receives the internal parity error signal 610, the timer timeout indication signal 622 and the signal 639 indicating whether internal operations are done and deasserts the parity error alert signal (ALERT_n→1'b1) if the timeout indication signal 622 indicates the timer has counted a tPAR_ALERT_PW time and signal 639 indicates that there are no pending internal operations. In some embodiments, the parity error alert signal generator 680 uses the activation of the precharge signal 636 directly to determine if internal operations are complete without the internal operations done detector block 638.

The system 600 and method 500 of implementing a parity error alert timing interlock ensures that the parity error alert signal (ALERT_n) is not deactivated prematurely while there are still internal operations in progress as this could lead to collisions between newly issued commands and those internal operations. The method 500 and system 600 also avoids configuring the parity error alert pulse width timer with a value much larger than the minimum required pulse width (tPAR_ALERT_PW(min)) because the actual parity error alert timing is now aligned to completion of internal operations. This improves the performance of memory device 100 because it is now able to issue commands after a parity error sooner than would be the case if tPAR_ALERT_PW was configured close to tPAR_ALERT_PW(max) so as to cover the worst-case process/voltage/temperature variations; worst-case configurations of tCK, CWL, tWR, and AL; and, worse-case delay associated with completion of internal operations. In fact, even where the configured tPAR_ALERT_PW is inadvertently less than the required tPAR_ALERT_PW(min), if internal operations are in progress when the parity error occurs, memory device 100 would not see a violation in the tPAR_ALERT_PW specification because the timing of the parity alert signal is aligned to the completion of such internal operations. Additionally, because for these embodiments memory device 100 does not ignore refresh commands issued before the parity error command disable signal and lasting during the tPAR_ALERT_ON+ tPAR_ALERT_PW window, there is no need for the memory controller to issue extra refresh cycles after the parity error alert signal is deactivated which improves the performance of memory device 100. In the event of a refresh in-progress when the parity error occurs, the refresh will finish unimpeded and the tPAR_ALERT_PW will time out after the parity alert timer expires (tPAR_ALERT_PW (min)+Margin) in embodiments allowing for a full refresh command period (tRFC) after the refresh command is issued before a new command may be issued. The predictability of the behavior of memory device 100 when parity errors occur while memory operations are in progress also eases verification and validation of memory device 100.

While the present disclosure contains many representative examples, these should not be construed as limitations on the scope of any disclosed methods or of what may be claimed, but rather as descriptions of features that may be specific to particular embodiments of particular disclosed methods. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document and attached appendices should not be understood as requiring such separation in all embodiments.

From the foregoing, it will be appreciated that specific embodiments of the present technology have been described herein for purposes of illustration, but that various modifications may be made without deviating from the scope of the technology. Further, while advantages associated with certain embodiments of the technology have been described in the context of those embodiments, other embodiments may also exhibit such advantages, and not all embodiments need necessarily exhibit such advantages to fall within the scope of the present technology. Accordingly, the present disclosure and associated technology can encompass other embodiments not expressly shown or described herein.

As used herein, the phrase "and/or," as in "A and/or B" refers to A alone, B alone, and A and B. As used herein, the terms "generally," "substantially equal to," and "about" when used to describe numeric values refer to values within 10% of the indicated value.

We claim:

1. A method for operating a memory device comprising:
   detecting a parity error associated with a command or address signal;
   enabling a parity error alert signal in response to detecting the parity error;
   detecting that a period of time substantially equal to a parity error alert pulse width value has elapsed;
   in response to detecting that the period of time has elapsed, detecting if memory operations are in progress, wherein the memory operations were initiated before detecting the parity error; and
   disabling the parity error alert signal in response to detecting that no memory operations are in progress.

2. The method of claim 1, wherein detecting that the period of time has elapsed further comprises detecting that a timer has counted the period of time.

3. The method of claim 2, wherein the timer is at least one of an analog delay element or a digital counter.

4. The method of claim 1, wherein the parity error alert pulse width value is substantially equal to 90 ns.

5. The method of claim 1, wherein detecting if the memory operations are in progress further comprises:
   latching a precharge timer clock in response to detecting that a command in-progress signal is enabled, wherein the precharge timer clock synchronizes a precharge operation of a memory of the memory device;
   unlatching the precharge timer clock in response to detecting that the command in-progress signal is disabled;
   generating a precharge pulse in response to detecting that the command in-progress signal is disabled and the precharge timer clock is deasserted; and
   determining that no memory operations are in progress based on detecting the generated precharge pulse.

6. The method of claim 2, wherein detecting that the timer has counted the period of time further comprises:
   receiving the parity error alert pulse width value;
   loading the timer with the received parity error alert pulse width value;
   starting the timer in response to enabling the parity error alert signal; and
   setting a signal indicating that the timer has counted the period of time substantially equal to the received parity error alert pulse width value.

7. The method of claim 6, wherein receiving the parity error alert pulse width value further comprises:
   receiving a minimum allowed parity error alert pulse width value;
   receiving a tolerance margin value for the minimum allowed parity error alert pulse width; and
   generating the parity error alert pulse width value based on the received minimum allowed parity error alert pulse width value and the received tolerance margin value.

8. The method of claim 1, wherein the memory device is a DRAM device.

9. A memory device, comprising:
   a parity error detector configured to receive a command or address signal and generate a parity error signal;
   a timer coupled to the parity error detector configured with a parity error alert pulse width value and further configured to receive the parity error signal and generate a timeout signal;
   an internal operations in progress detector configured to determine if internal memory operations are in progress and generate an internal operations done signal when no internal memory operations are in progress, wherein the internal memory operations were initiated before the parity error detector generates the parity error signal; and
   a parity error alert signal generator coupled to the internal operations in progress detector, the timer, and the parity error detector, configured to generate a parity error alert signal based on the parity error signal, the timeout signal, and the internal operations done signal.

10. The memory device of claim 9, wherein the parity error detector is further configured to determine a parity of the command or address signal, compare the determined parity with a parity scheme of the memory device, and drive the parity error signal to a logic one value in response to detecting that the determined parity violates the parity scheme of the memory device.

11. The memory device of claim 9, wherein the timer is at least one of an analog delay element or a digital counter.

12. The memory device of claim 9, wherein the parity error alert pulse width value is programmable.

13. The memory device of claim 9, wherein the parity error alert pulse width value is substantially equal to 90 ns.

14. The memory device of claim 9, wherein the internal operations in progress detector further comprises:
   a precharge generator configured to receive a command in-progress signal and a precharge timer clock;
   sequential logic configured to latch the precharge timer clock in response to detecting that the command in-progress signal is asserted; and
   combinational logic configured to generate a precharge pulse in response to detecting that the command in-progress signal is deasserted and the precharge timer clock is deasserted, wherein the internal operations done signal is generated in response to the generation of the precharge pulse.

15. The memory device of claim 14, wherein the asserted command in-progress signal corresponds to a logic zero value, the deasserted command in-progress signal corresponds to a logic one value, the deasserted precharge timer clock corresponds to the logic zero value, and the precharge timer clock synchronizes a precharge operation of a memory of the memory device.

16. The memory device of claim 10, wherein the timer is further configured to start a timer operation in response to detecting a state transition of the parity error signal from a logic zero value to the logic one value, and further configured to activate the timeout signal in response to detecting that a period substantially equal to the configured parity error alert pulse width value has elapsed since the start of the timer operation.

17. The memory device of claim 10, wherein the parity error alert signal generator further comprises logic circuitry configured to assert the parity error alert signal in response to detecting a state transition of the parity error signal from a logic zero value to the logic one value, and deassert the parity error alert signal in response to detecting the timeout signal and the internal operations done signal.

18. The memory device of claim 17, wherein the logic circuitry further comprises logic configured to deassert the parity error alert signal if the timeout signal is the logic one value and the internal operations done signal is the logic one value.

19. The memory device of claim 17, wherein the parity error alert signal generator asserts the parity error alert signal by driving the parity error alert signal to the logic zero value, and deasserts the parity error alert signal by driving the parity error alert signal to the logic one value.

20. A memory device, comprising:
 means for detecting a parity error in a command or address signal;
 means for counting a period of time substantially equal to a parity error alert pulse width value;
 means for detecting whether one or more internal memory operations are in progress; and
 means for generating a parity error alert signal in response to detecting the parity error, counting the period of time, and detecting whether the one or more internal memory operations are in progress, wherein the parity error alert signal is asserted in response to detecting the parity error, and the parity error alert signal is deasserted in response to counting the period of time and detecting no internal memory operations in progress, and wherein the one or more internal memory operations were initiated before detecting the parity error.

* * * * *